(12) United States Patent
Liang

(10) Patent No.: US 7,411,788 B2
(45) Date of Patent: Aug. 12, 2008

(54) COOLING FAN DEVICE FOR A COMPUTER

(75) Inventor: Chien-Fa Liang, Chung-Ho (TW)

(73) Assignee: Super Micro Computer, Inc., San Jose, CA (US)

( * ) Notice: Subject to any disclaimer, the term of this patent is extended or adjusted under 35 U.S.C. 154(b) by 49 days.

(21) Appl. No.: 11/501,014

(22) Filed: Aug. 9, 2006

(65) Prior Publication Data

US 2008/0037216 A1   Feb. 14, 2008

(51) Int. Cl.
*H05K 7/20*   (2006.01)
(52) U.S. Cl. ................. 361/695; 361/694; 454/184
(58) Field of Classification Search ........... 361/687, 361/694, 695; 454/184; 415/213.1, 214.1; 417/423.1, 360
See application file for complete search history.

(56) References Cited

U.S. PATENT DOCUMENTS

| | | | | |
|---|---|---|---|---|
| 5,822,186 A | * | 10/1998 | Bull et al. | 361/695 |
| 6,031,719 A | * | 2/2000 | Schmitt et al. | 361/695 |
| 6,186,889 B1 | * | 2/2001 | Byrne | 454/184 |
| 6,213,819 B1 | * | 4/2001 | Fan | 439/894 |
| 6,236,564 B1 | * | 5/2001 | Fan | 361/695 |
| 6,313,989 B1 | * | 11/2001 | Kuang | 252/62.9 PZ |
| 6,343,011 B1 | * | 1/2002 | Yu | 361/695 |
| 6,504,716 B2 | * | 1/2003 | Huang et al. | 361/695 |
| 6,817,939 B2 | * | 11/2004 | Gan et al. | 454/184 |
| 6,826,048 B1 | * | 11/2004 | Dean et al. | 361/695 |
| 6,896,611 B2 | * | 5/2005 | Giraldo et al. | 454/184 |
| 6,999,313 B2 | * | 2/2006 | Shih | 361/695 |
| 7,292,436 B2 | * | 11/2007 | Yang | 361/695 |

* cited by examiner

*Primary Examiner*—Gregory D Thompson
(74) *Attorney, Agent, or Firm*—Troxell Law Office, PLLC

(57) ABSTRACT

A cooling fan device for a computer including a fan device having a primary housing and a side housing. A computer casing a side walls having an area with air permeable holes, right positioning slots, and a left positioning slot. Projection parts of the primary housing are latched into the right positioning slots, and a flange part on a press plate is latched into the left positioning slot, such that the fan device can be quickly assembled on or disassembled from the computer casing without using screws.

4 Claims, 5 Drawing Sheets

COOLING FAN DEVICE FOR A COMPUTER

BACKGROUND OF THE INVENTION (a) Field of the Invention

The present invention relates to a cooling fan locking device for a computer, and more particularly to a cooling fan locking device which can be quickly, conveniently assembled and disassembled without using screws.

(b) Description of the Prior Art

It is known that a conventional fan for a computer is always installed in an interior of a computer casing, and is always fixed with screws, which is very awkward and inconvenient in assembling and disassembling.

SUMMARY OF THE INVENTION

The primary object of present invention is to provide a cooling fan locking device for a computer, such that a fan device can be quickly assembled on or disassembled from a computer casing without using screws.

To enable a further understanding of the said objectives and the technological methods of the invention herein, the brief description of the drawings below is followed by the detailed description of the preferred embodiments.

DETAILED DESCRIPTION OF THE PREFERRED EMBODIMENTS

Figure 1:
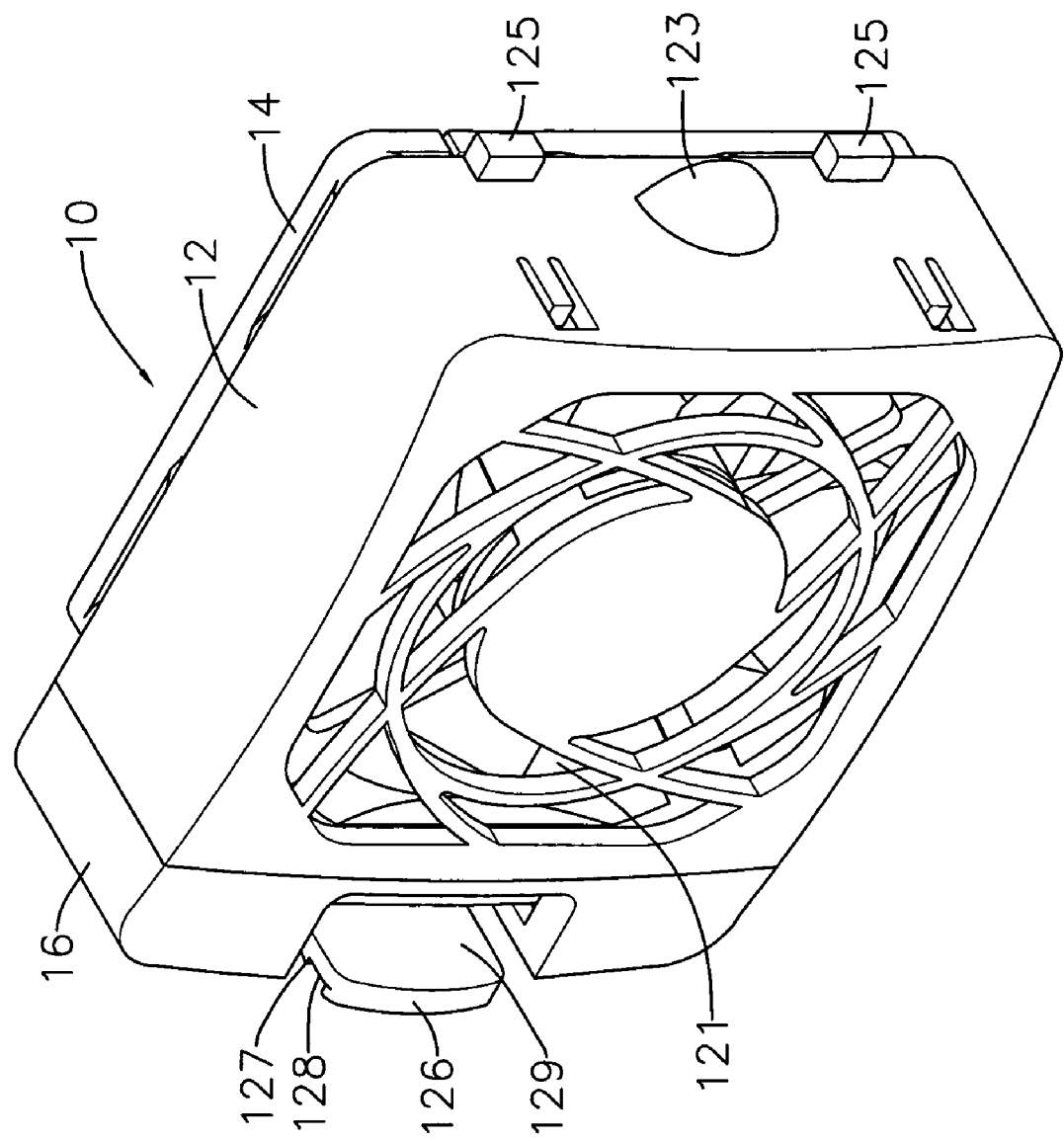
FIG. 1 shows a perspective view of the present invention.
Figure 2:
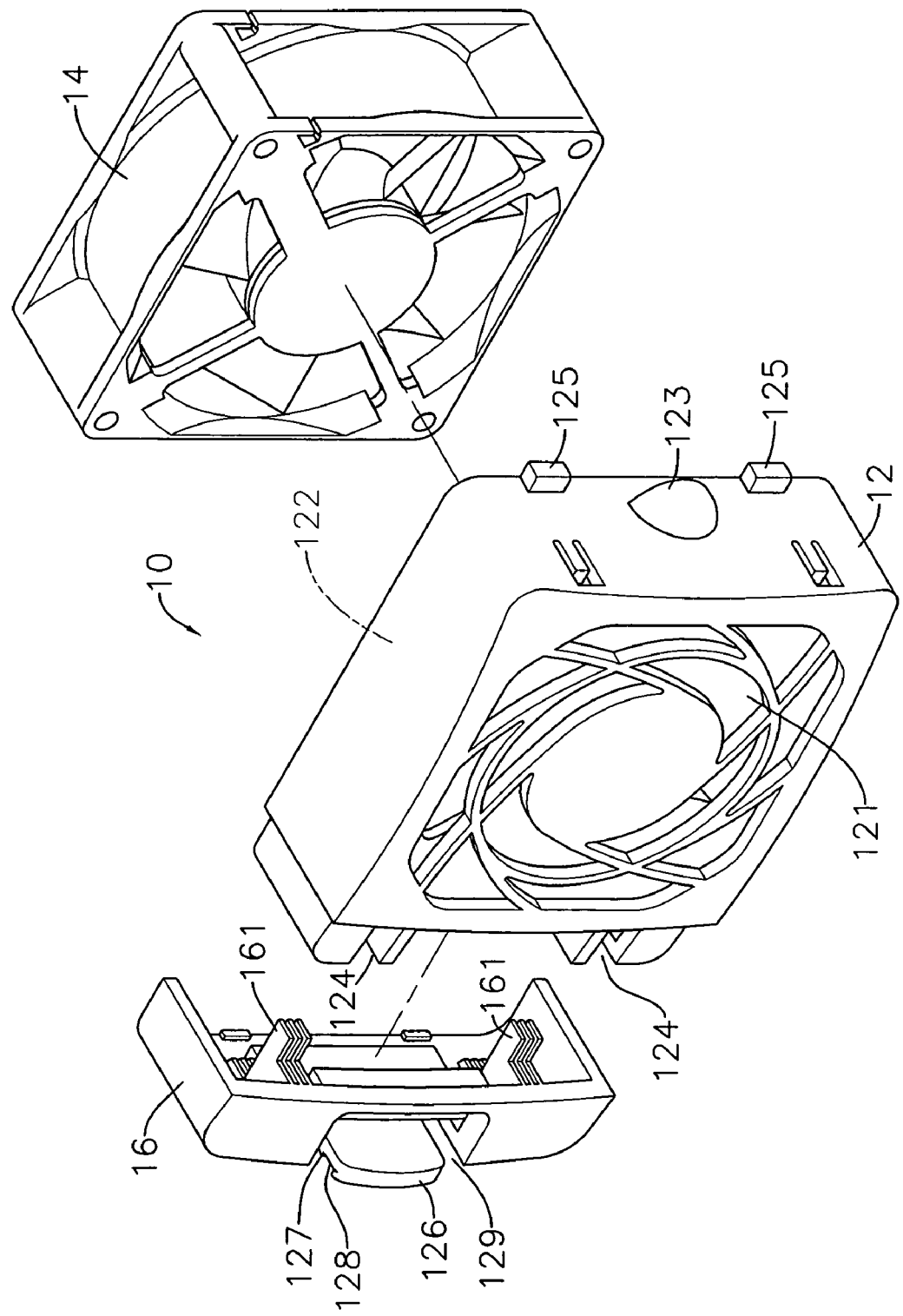
FIG. 2 shows an exploded view of parts of the present invention.

Referring to FIG. 1 and FIG. 2, the present invention is to provide a cooling fan locking device for a computer, including at least more than one fan device 10 composed of a primary housing 12, an exterior surface of which is provided with an area of ventilation holes 121, a back surface of which is provided with a sink 122 for latching with a fan 14, a side of which is provided with at least more than one insertion slot 124, and an edge at the other side of which is provided with at least more than one projection part 125; a side housing 16, an interior of which is protruded with a plurality of insertion pieces 161 which can be inserted into the insertion slots 124; and a flexible press plate 126, which is located at a side of the side housing 16, and a surface of which is provided with a transversal flange part 127 and a locking slot 128.

Figure 3:
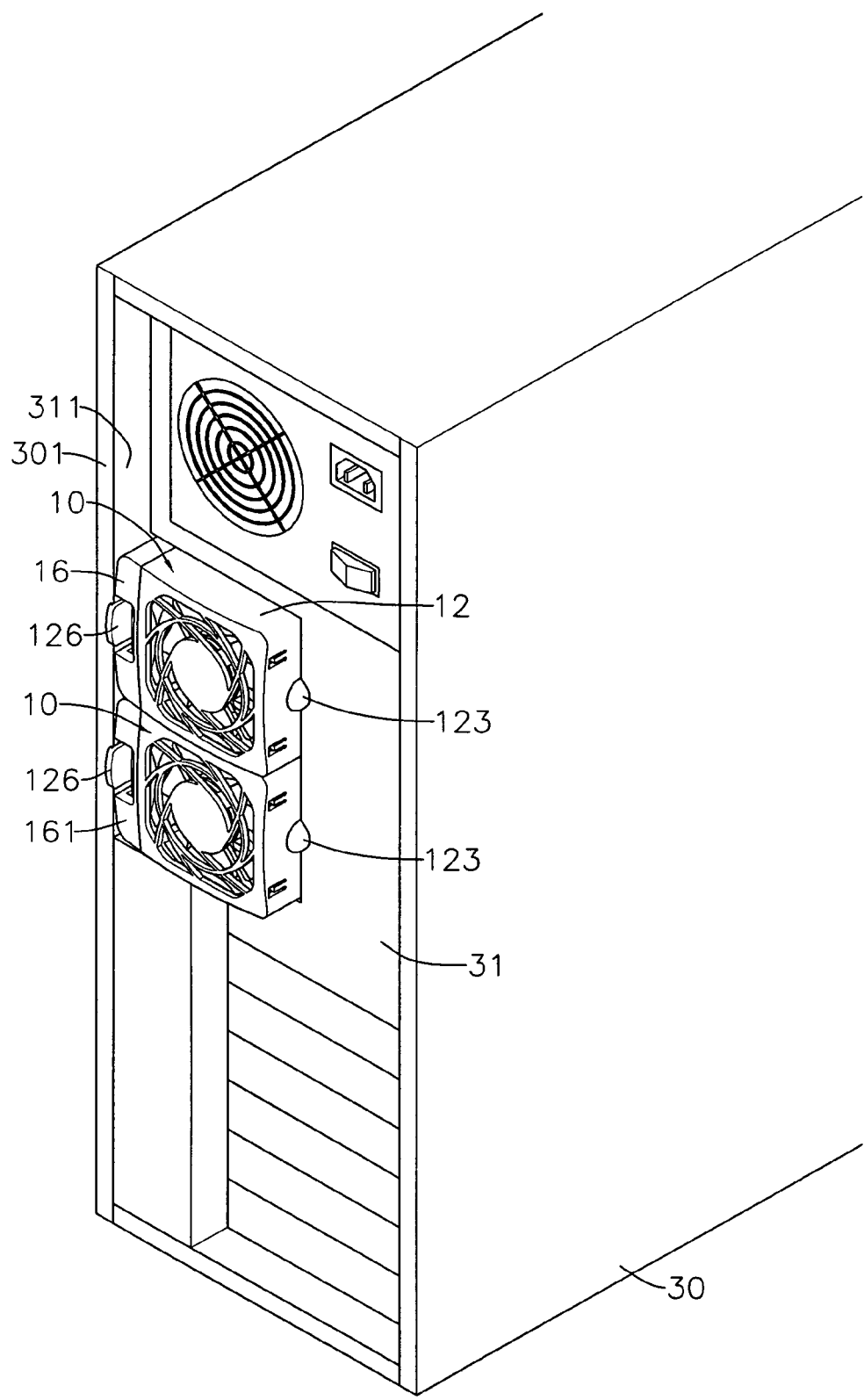
FIG. 3 shows a schematic view of a fan device which is latched on a computer casing of the present invention.
Figure 4:
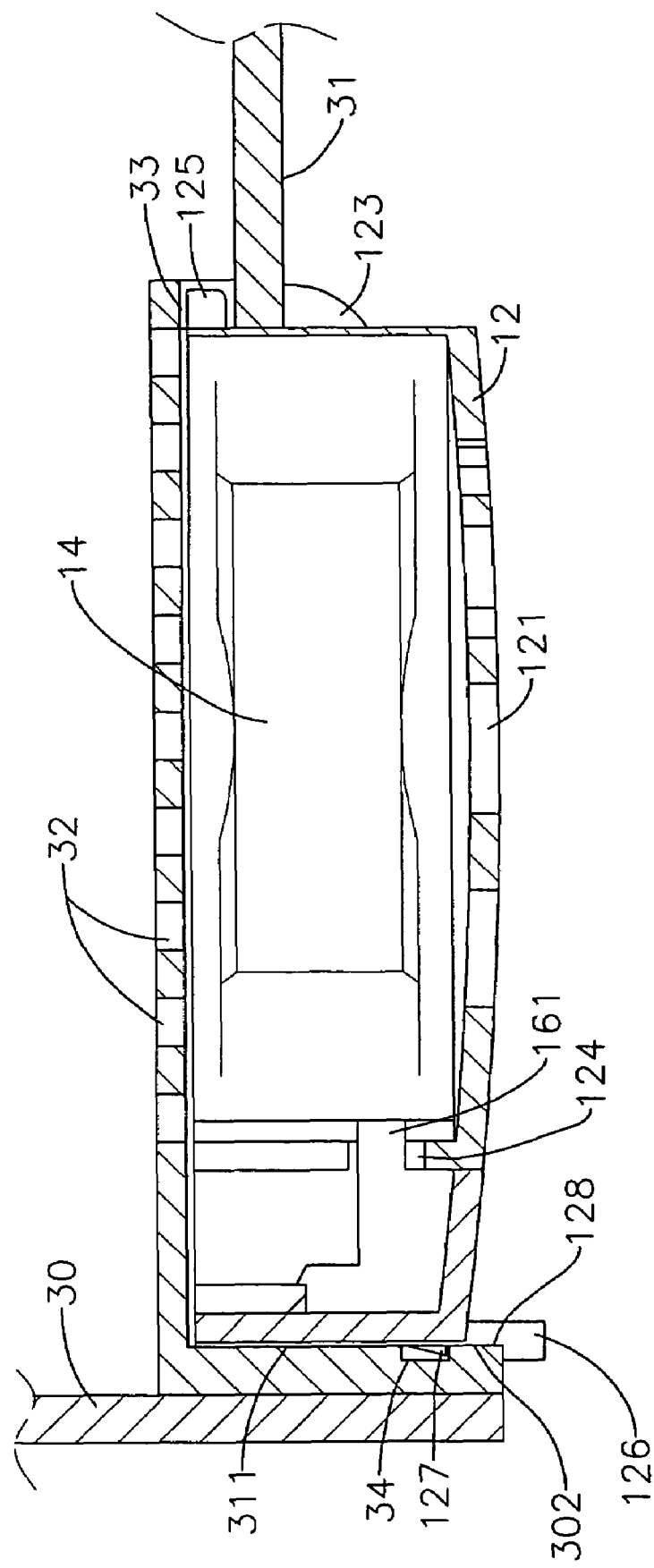
FIG. 4 shows a cross sectional view of a fan device which is latched on a computer casing of the present invention.

Referring to FIG. 3, a side wall 31 of a computer casing 30 is provided with an area of a plurality of air permeable holes 32 (as shown in FIG. 4), and a left and right walls of the area of air permeable holes 32 are provided with right positioning slots 33 and a left positioning slot 34, respectively.

The projection parts 125 of primary housing 12 can be latched into the right positioning slots 33, and the flange part 127 on the press plate 126 can be latched into the left positioning slot 34, such that the fan devices 10 can be locked and positioned at exteriors of the areas of air permeable holes 32 (as shown in FIG. 4).

Referring to FIG. 1, a concaved part 129 is located below the press plate 126, and the press plate 126 can be elastically displaced in the concaved part 129 when subjected to pressure.

A rear side of the primary housing 12 is provided with an abut part 123 which can be abutted on the side wall 31 of computer casing 30 (as shown in FIG. 3).

Referring to FIG. 4, the right positioning slots 33 are located on a vertical wall at a side edge of the side wall 31, and the left positioning slots 34 are located on a vertical wall 311 at a side edge of the air permeable hole 32.

Referring to FIG. 2, a fan device 10 is assembled from a side housing 16, a primary housing 12, and a fan 14, wherein insertion pieces 161 are plural, and the neighboring insertion pieces 161 are all separated by a distance, enabling an overall thickness (or height) of the plural insertion pieces 161 to be a little larger than a width of an insertion slot 124.

Accordingly, after the plural insertion pieces 161 are inserted into the insertion slot 124, a flexible (elastic) compression (tightening) state is formed, such that the plural insertion pieces 161 are in a locking and positioning state within the insertion slot 124, thereby locking the side housing 16 on the primary housing 12. The fan 14 body is in a shape of square block, and can be fitted into a sink 122.

Figure 5:
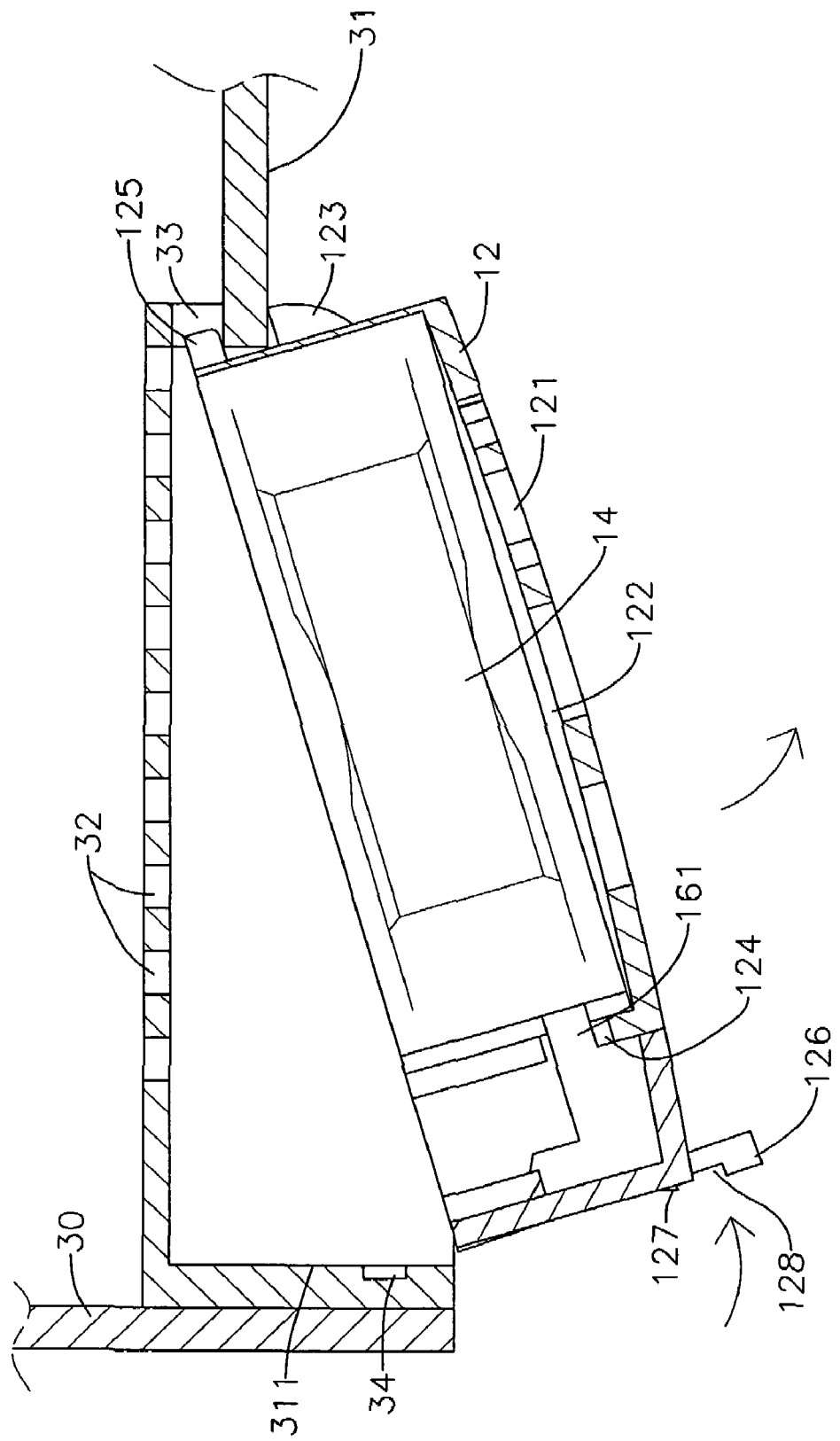
FIG. 5 shows a cross sectional view of a motion of removing a fan device out of a computer casing of the present invention.

Referring to FIG. 4 and FIG. 5, two projection parts 125 are transfixed into right positioning slots 33, such that the fan device 10 is positioned into the right positioning slots 33 and then rotated, to enable flange part 127 to be locked into left positioning slot 34. Referring to FIG. 4, as a predetermined thickness 302 is formed between the long-strip left positioning slot 34 and an outer edge 301 of a computer casing 30, the flange part 127 can be latched into the left positioning slot 34, and a locking slot 128 is exactly latched on the thickness 302, such that the fan device 10 can be latched and fixed on the casing 30. When the fan 14 starts operating, air can be blown into the casing 30 through air permeable holes 32 to cool down parts in the casing 30, wherein a side surface of an abut part 123 is abutted on a side wall 31 of the casing 30, such that once the primary housing 12 is subjected to external pressure, the abut part 123 can be abutted on the side wall 31 to enhance an intensity for sustaining with the force.

On the other hand, when the fan device 10 is to be taken out, as long as an operator uses fingers to press on a press plate 126, enabling the press plate 126 to be elastically deformed to be flexibly displaced toward a concaved part 129, and to pull it out, the press plate 126 will be released from the left positioning slot 34, and the projection parts 125 will be also removed from the right positioning slots 33. Therefore, the entire fan device 10 can be very quickly disassembled from the casing 30 (as shown in FIG. 5).

Referring to FIG. 2, the operator users fingers to exert force, to pull out the side housing 16, then the plural insertion pieces 161 will be released from the insertion slot 124, such that the plural insertion pieces 161 can be elastically restored to their original state (i.e., restoring to their original width) from the compressed state. Next, the fan device 14 is taken out of the sink 122, thereby achieving objects of replacing or repairing parts.

Accordingly, the cooling fan locking device of present invention allows the fan device to be assembled on and disassembled from the computer casing 30 more quickly and conveniently, without locking and unlocking by screws.

It is of course to be understood that the embodiments described herein is merely illustrative of the principles of the invention and that a wide variety of modifications thereto may be effected by persons skilled in the art without departing from the spirit and scope of the invention as set forth in the following claims.

What is claimed is:

1. A cooling fan device for a computer, comprising:

at least one fan device having a primary housing, a side housing, and a fan; the primary housing has an area of ventilation holes located through an exterior surface thereof, a sink located on a back surface thereof for latching with the fan, a plurality of insertion slots located on a first side thereof, and a plurality of projection parts located on a second side thereof; the side housing has a plurality of insertion pieces protruding outwardly from an interior thereof and inserted into the plurality of insertion slots, and a flexible press plate located on a side of the side housing, the flexible press plate has a transversal flange part and a locking slot located on a surface thereof; and a computer casing has a side wall having an area with a plurality of air permeable holes, right positioning slots located in a right wall relative to the area with the plurality of air permeable holes, and a left positioning slot located in a left wall relative to the area with the plurality of air permeable holes, wherein the plurality of projection parts of primary housing are latched into the right positioning slots, and the flange part on the press plate is latched into the left positioning slot, the fan device is selectively connected to and removed from the computer casing.

2. The device according to claim 1, further comprising a concaved part located below the press plate, wherein, when the press plate is subjected to pressure, it is elastically displaced in the concaved part.

3. The device according to claim 1, wherein the second side of the primary housing is provided with an abut part abutting the side wall of the computer casing when the fan device is connected to the computer casing.

4. The device according to claim 1, wherein the right positioning slots are located on a vertical wall located at a side edge of the side wall, and the left positioning slot is located on a vertical wall located at a side of the air permeable holes.

* * * * *